(12) United States Patent
Sato

(10) Patent No.: US 6,665,052 B2
(45) Date of Patent: Dec. 16, 2003

(54) ILLUMINATION OPTICAL SYSTEM AND PROJECTION EXPOSURE APPARATUS

(75) Inventor: Hiroshi Sato, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/238,509

(22) Filed: Jan. 27, 1999

(65) Prior Publication Data

US 2002/0154284 A1 Oct. 24, 2002

(30) Foreign Application Priority Data

Jan. 30, 1998 (JP) .......................... 10-018929
Jan. 8, 1999 (JP) .......................... 11-002731

(51) Int. Cl.[7] .................. G03B 27/72; G03B 27/42; G03B 27/54; A61N 5/00
(52) U.S. Cl. .................. 355/71; 355/53; 355/67; 250/492.1
(58) Field of Search .................. 355/53, 67, 70, 355/71; 250/492.22, 492.1, 548; 430/30, 22; 359/621, 637, 20

(56) References Cited

U.S. PATENT DOCUMENTS

| | | | | |
|---|---|---|---|---|
| 5,251,068 A | * | 10/1993 | Oshima et al. | 359/634 |
| 5,760,963 A | | 6/1998 | Mori | 359/622 |
| 5,822,125 A | * | 10/1998 | Meyers | 359/621 |
| 5,926,257 A | | 7/1999 | Mizouchi | 355/67 |
| 5,994,006 A | * | 11/1999 | Nishi | 430/22 |
| 6,051,842 A | * | 4/2000 | Yamamoto | 250/548 |
| 6,084,655 A | * | 7/2000 | Suzuki et al. | 355/53 |
| 6,115,107 A | * | 9/2000 | Nishi | 355/68 |

FOREIGN PATENT DOCUMENTS

| | | |
|---|---|---|
| JP | 7-37774 | 2/1995 |
| JP | 7-306304 | 11/1995 |
| JP | 8-262367 | 10/1996 |
| JP | 9-22869 | 1/1997 |
| JP | 9-127418 | 5/1997 |
| JP | 9-190969 | 7/1997 |
| JP | 9-223661 | 8/1997 |
| JP | 2001-57298 | 2/2001 |

* cited by examiner

Primary Examiner—Russell Adams
Assistant Examiner—Peter B. Kim
(74) Attorney, Agent, or Firm—Fitzpatrick, Cella, Harper & Scinto

(57) ABSTRACT

An illumination optical system includes a fly's eye lens, having a plurality of small lens elements, for forming secondary light sources by use of light from a light source, an optical device for illuminating a surface to be illuminated, with light from the secondary light sources, wherein the optical device is arranged to assure that the secondary light sources as seen from points on the surface illuminated have substantially the same numerical aperture, an optical filter for restricting, at an entrance side of the fly's eye lens, a quantity of light entering a desired small lens element of the plurality of small lens elements constituting the fly's eye lens, and a driver for driving the optical filter.

14 Claims, 15 Drawing Sheets

TRANSMISSION FACTOR
CHARACTERISTIC OF
OPTICAL FILTER 52

ON AXIS

ILLUMINANCE
DISTRIBUTION CHANGE

TRANSMISSION FACTOR CHARACTERISTIC OF OPTICAL FILTER 53

ILLUMINANCE DISTRIBUTION CHANGE

DISTORTION FOR
CORRECTING
PERIPHERAL
ILLUMINANCE

EXAMPLE OF SECONDARY
LIGHT SOURCES AS VIEWED FROM
THE SURFACE ILLUMINATED

ILLUMINATION OPTICAL SYSTEM AND PROJECTION EXPOSURE APPARATUS

FIELD OF THE INVENTION AND RELATED ART

This invention relates to an illumination optical system and, more particularly, to an illumination optical system suitably usable in an illumination optical device of a projection exposure apparatus for the manufacture of semiconductor devices, for example.

In projection exposure apparatuses for the manufacture of semiconductor devices, a circuit pattern formed on a reticle (mask) is projected onto a semiconductor substrate such as a wafer through a projection optical system, by which projection exposure is performed.

In conventional projection exposure apparatuses, light from a light source having a predetermined luminance distribution or from an image of such a light source is projected on a fly's eye lens. With secondary light sources as defined in the neighborhood of the light exit surface of the fly's eye lens, a condenser optical system illuminates a reticle having a circuit pattern formed thereon. In this manner, the surface to be illuminated (such as a reticle or a wafer) is illuminated uniformly.

It is known that, in the projection through a condenser optical system, as a condition for providing a uniform numerical aperture of an illumination optical system upon the surface to be illuminated, the fly's eye lens should satisfy the sine condition. If the focal length of small lens elements constituting the fly's eye lens is F, the largest incidence height of the illumination optical system parallel to the optical axis of the small lens elements is h, and the angle defined, with respect to the optical axis, by an emitted light ray having been incident at the largest incidence height is θ, then the sine condition can be expressed by:

$$h = F \cdot \sin \theta.$$

Generally, a fly's eye lens comprises small lens elements of a rod-like shape having convex spherical surfaces at its opposite ends, being disposed two-dimensionally. With such a fly's eye lens, the sine condition as above cannot be satisfied sufficiently and, therefore, there is a tendency that due to insufficient satisfaction of the sine condition the illuminance decreases from the center of the surface being illuminated toward its periphery.

Further, an anti-reflection film used in a lens has a characteristic that it reflects lights more with a larger incidence angle of light. Since generally light rays passing through the periphery of a lens have a larger incidence angle, also there is a tendency that the illuminance upon the surface being illuminated decreases from the center toward the periphery.

In consideration of this, in conventional projection exposure apparatuses, in order to prevent non-uniformness of illuminance wherein the illuminance at the periphery of the surface being illuminated is lower than that at the center thereof and thereby to attain uniform illuminance upon the surface being illuminated, a condenser optical system is used to positively produce distortion aberration such as shown in FIG. 15A, to thereby prevent a decrease in quantity of light impinging on the peripheral portion.

When a condenser optical system effective to produce distortion aberration of FIG. 15A is used, due to an unchangeable quantity of Helmholz-Lagrange, the secondary light sources as can be observed from various points on the surface being illuminated differ in size, between points on the axis and off the axis, such as shown in FIG. 15B. For example, in FIG. 15B, the secondary light sources as can be observed at different points have the same shape, at any point within the picture field. However, if the largest light intensity is 100 and comparing diameters of contour lines of light intensity 20, it is seen that the diameter is larger at points off the axis, as compared with the diameter at a point on the axis. Namely, in conventional projection exposure apparatuses, a condenser lens is used to positively produce distortion aberration and, as a result of this, secondary light sources observed on the axis and off the axis, upon the surface being illuminated, differ in size (σ value).

In recent projection exposure apparatuses for the manufacture of semiconductor devices, enlargement of integration of VLSI has required a higher image uniformity over the whole surface being illuminated, than required before. In order to meet this, the illumination optical system should provide uniformness of illuminance upon the surface to be illuminated as well as uniformness, over the whole surface to be illuminated, in size of secondary light sources as can be observed from various points on the surface being illuminated.

Here, if the numerical aperture of an illumination optical system is $NA_{il}$ and the numerical aperture of a projection optical system is $NA_{po}$, the secondary light sources (effective light sources) can be expressed by a value:

$$\sigma = NA_{il}/NA_{po}$$

For example, in accordance with results of experiments made to a projection exposure apparatus under the condition that the wavelength is 248 nm and the image side numerical aperture NA is 0.6, it has been found that, when σ changes by 0.1, the linewidth of an isolated line of 0.3 micron linewidth changes by about 20 nm. From the uniformness of linewidth within the picture field as currently being required, the effect of a secondary light source (σ) difference in the surface to be illuminated, upon the linewidth, should be kept low of about 5 nm or less. In order to attain this, if the largest diameter of those of the secondary light sources observed at various points on the surface being illuminated, which can be regarded as having the same intensity ratio, is denoted by $\sigma_{max}$ while the smallest diameter thereof is denoted by $\sigma_{min}$, preferably the balance difference of $\sigma_{max}$ and $\sigma_{min}$ should be not greater than 3%, at the maximum.

However, with illumination optical systems conventionally used in projection exposure apparatuses, it is difficult to satisfy both the uniformness of illuminance and the uniformness of illumination numerical aperture, upon the surface being illuminated.

SUMMARY OF THE INVENTION

It is an object of the present invention to provide an illumination optical system and/or a projection exposure apparatus by which both the uniformness of illuminance and the uniformness of illumination numerical aperture, upon the surface being illuminated, can be improved.

In accordance with a first aspect of the present invention, there is provided an illumination optical system, comprising: secondary light source forming means for forming secondary light sources by use of light from a light source; and optical means for illuminating a surface to be illuminated, with light from the secondary light sources; wherein the secondary light sources as seen from points on the surface illuminated have substantially the same numerical aperture and wherein illuminance on the surface illuminated is substantially uniform.

In accordance with a second aspect of the present invention, there is provided an illumination optical system, comprising: secondary light source forming means for forming secondary light sources by use of light from a light source; optical means for illuminating a surface to be illuminated, with light from the secondary light sources, wherein said optical means is arranged to assure that the secondary light sources as seen from points on the surface illuminated have substantially the same numerical aperture; and illuminance uniforming means effective to make the illuminance on the surface illuminated uniform.

In accordance with a third aspect of the present invention, there is provided an illumination optical system, comprising: a fly's eye lens for forming secondary light sources by use of light from a light source, and optical means for illuminating a surface to be illuminated, with light from the secondary light sources, wherein said fly's eye lens has a plurality of small lens elements each comprising an aspherical surface lens.

In accordance with a fourth aspect of the present invention, there is provided an illumination optical system, comprising: a fly's eye lens for forming secondary light sources by use of light from a light source; optical means for illuminating a surface to be illuminated, with light from the secondary light sources, wherein said fly's eye lens has a plurality of small lens elements each comprising a diffractive optical element.

In accordance with a fifth aspect of the present invention, there is provided an illumination optical system, comprising: secondary light source forming means for forming secondary light sources by use of light from a light source; optical means for illuminating a surface to be illuminated, with light from the secondary light sources; scanning means for scanning the surface to be illuminated, wherein the surface to be illuminated is illuminated while being scanned by said scanning means; wherein said optical means is arranged to assure that the secondary light sources as seen from points on the surface illuminated have substantially the same numerical aperture; and a variable slit disposed at or adjacent to a plane optically conjugate with the surface to be illuminated, for changing a width in a scan direction of an illumination region upon the surface to be illuminated, such that the width in the scan direction of the illumination region can be changed by said variable slit in accordance with an illuminance distribution on the illumination region.

In accordance with a sixth aspect of the present invention, there is provided an illumination optical system, comprising: secondary light source forming means for forming secondary light sources by use of light from a light source; a stop for restricting the shape of the secondary light sources; optical means for illuminating a surface to be illuminated, with light from the secondary light sources; scanning means for scanning the surface to be illuminated, wherein the surface to be illuminated is illuminated while being scanned by said scanning means; and a variable slit disposed at or adjacent to a plane optically conjugate with the surface to be illuminated, for changing a width in a scan direction of an illumination region upon the surface to be illuminated, such that the width in the scan direction of the illumination region can be changed by said variable slit in accordance with a change in shape of the secondary light sources.

In accordance with a seventh aspect of the present invention, there is provided a projection exposure apparatus, comprising: an illumination optical system including (i) secondary light source forming means for forming secondary light sources by use of light from a light source, (ii) optical means for directing light from the secondary light sources to a reticle; a projection optical system for projecting a pattern, formed on the reticle, onto the surface of a wafer; wherein said optical means is arranged to assure that the secondary light sources as seen from points on a surface being illuminated have substantially the same numerical aperture; and illuminance uniforming means effective to make the illuminance on the surface illuminated uniform.

In accordance with an eighth aspect of the present invention, there is provided a projection exposure apparatus, comprising: an illumination optical system including (i) a fly's eye lens for forming secondary light sources by use of light from a light source, and (ii) optical means for directing light from the secondary light sources to a reticle; and a projection optical system for projecting a pattern formed on the reticle, onto a surface of a wafer, wherein said fly's eye lens has a plurality of small lens elements each comprising an aspherical surface lens.

In accordance with a ninth aspect of the present invention, there is provided a projection exposure apparatus, comprising: an illumination optical system including (i) a fly's eye lens for forming secondary light sources by use of light from a light source, and (ii) optical means for directing light from the secondary light sources to a reticle; and a projection optical system for projecting a pattern formed on the reticle, onto a surface of a wafer; wherein said fly's eye lens has a plurality of small lens elements each comprising a diffractive optical element.

In accordance with a tenth aspect of the present invention, there is provided a projection exposure apparatus, comprising: an illumination optical system including (i) secondary light source forming means for forming secondary light sources by use of light from a light source, and (ii) optical means for directing light from the secondary light sources to a reticle; a projection optical system for projecting a pattern formed on the reticle, onto a surface of a wafer; scanning means for scanning the reticle and the wafer in synchronism with each other, wherein the pattern is transferred to the wafer with the scan by said scanning means; wherein said optical means is arranged to assure that the secondary light sources as seen from points on a surface illuminated have substantially the same numerical aperture; and a variable slit disposed at or adjacent to a plane optically conjugate with the surface to be illuminated, for changing a width in a scan direction of an illumination region upon the surface to be illuminated, such that the width in the scan direction of the illumination region can be changed by said variable slit in accordance with an illuminance distribution on the illumination region.

In accordance with an eleventh aspect of the present invention, there is provided a projection exposure apparatus, comprising: an illumination optical system including (i) secondary light source forming means for forming secondary light sources by use of light from a light source, and (ii) optical means for directing light from the secondary light sources to a reticle; a projection optical system for projecting a pattern of the reticle, onto a surface of a wafer; scanning means for scanning the reticle and the wafer in synchronism with each other, wherein the pattern is transferred to the wafer with the scan by said scanning means; wherein said optical means is arranged to assure that the secondary light sources as seen from points on a surface illuminated have substantially the same numerical aperture; and a variable slit disposed at or adjacent to a plane optically conjugate with the surface to be illuminated, for changing a width in a scan direction of an illumination region upon the surface to be illuminated, such that the width in the scan direction of the illumination region can be changed by said variable slit in accordance with a change in shape of the secondary light sources.

In accordance with a twelfth aspect of the present invention, there is provided a device manufacturing method, comprising the steps of: transferring, by exposure, a pattern formed on a reticle onto a wafer with use of a projection exposure apparatus in accordance with any one of the seventh to eleventh aspects of the present invention as described above; and developing the pattern transferred to the wafer.

In accordance with a thirteenth aspect of the present invention, there is provided a fly's eye lens, comprising: a plurality of small lens elements at least one of which has at least one aspherical lens surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
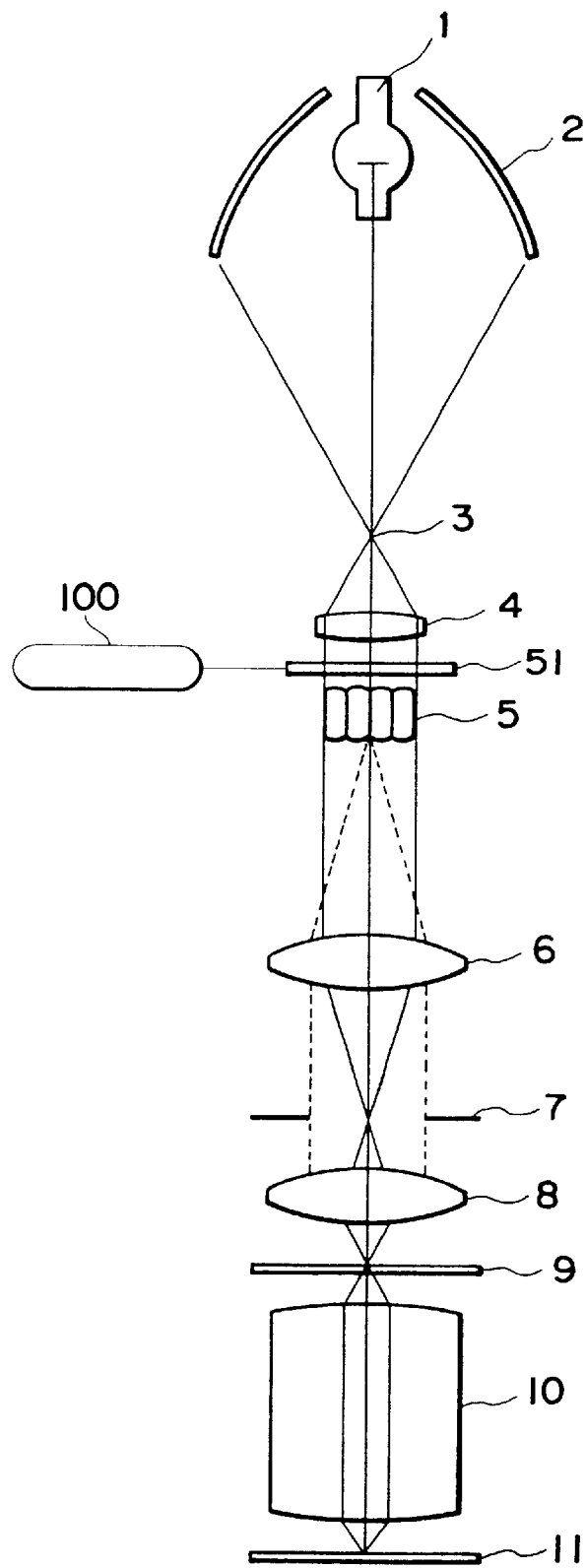
FIG. 1 is a schematic view of a projection exposure apparatus according to a first embodiment of the present invention.

FIG. 1 is a schematic view of a projection exposure apparatus having an illumination optical system according to a first embodiment of the present invention.

Denoted at 1 is a light source such as a Hg lamp, for example. Light from the light source 1 is imaged upon a second focal point 3 of an elliptical mirror 2. Denoted at 4 is an optical system which comprises a condenser lens, a collimator lens or a zoom lens, for example, for collimating an image of a light emitting portion of the light source 1, formed adjacent to the second focal point 3, and for projecting it onto a light entrance surface of a fly's eye lens 5. The fly's eye lens 5 comprises a plurality of small lenses having a rectangular shape in section and being arrayed two-dimensionally at a predetermined pitch. Secondary light sources are formed adjacent to the light exit surface of it. Denoted at 6 is a condenser optical system which comprises a condenser lens, a collimator lens or a zoom lens, for example.

Denoted at 7 is a masking blade having movable light blocking plates for variably defining a desired aperture shape. Denoted at 8 is a lens system for illuminating a reticle 9 on which an electronic circuit pattern is formed. Denoted at 10 is a projection optical system (projection lens) for projecting the reticle 9 in a reduced scale. Denoted at 11 is a wafer (substrate) onto which the circuit pattern of the reticle 9 is to be projected and transferred thereby.

In the illumination optical system of this embodiment, distortion aberration of the condenser optical system 6 is kept sufficiently small, by which imbalance in size (numerical aperture) of the secondary light sources as observed at respective points upon the surface being illuminated is removed. More specifically, dispersion in size of the secondary light sources observed at the points upon the surface being illuminated is suppressed to 3% or less, such that the sizes of the secondary light sources upon the surface being illuminated can be regarded as being substantially uniform. Here, in order to correct illuminance non-uniformness (peripheral illuminance is low) resulting from insufficient satisfaction of the sine condition by the fly's eye lens 5 and from the transmission characteristic of the antireflection film, dependent upon the light incidence angle, there is illuminance uniforming means provided in the illumination optical system.

Figure 2A:
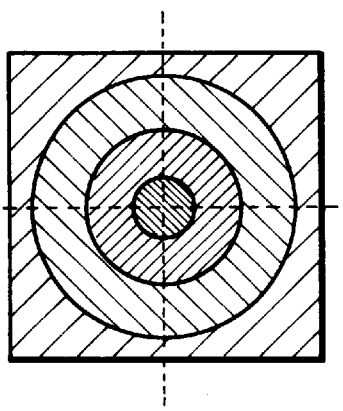
FIGS. 2A–2E are schematic views, respectively, for explaining correction of non-uniformness of illuminance, in the first embodiment of the present invention.
Figure 2B:
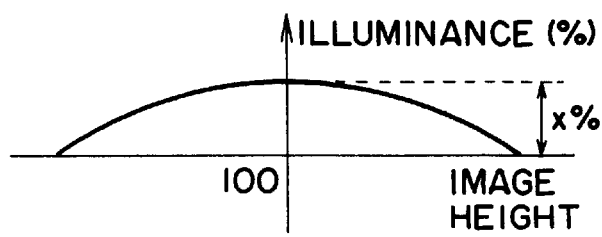

Now, correction of such illuminance non-uniformness that the illuminance is symmetrical with respect to an optical axis but it is low at the periphery, as shown in FIG. 2A or 2B, will be considered. FIG. 2A is a contour view, showing an illuminance distribution upon a surface being illuminated. FIG. 2B is a graph wherein a reference axis is taken on the optical axis.

Figure 2C:
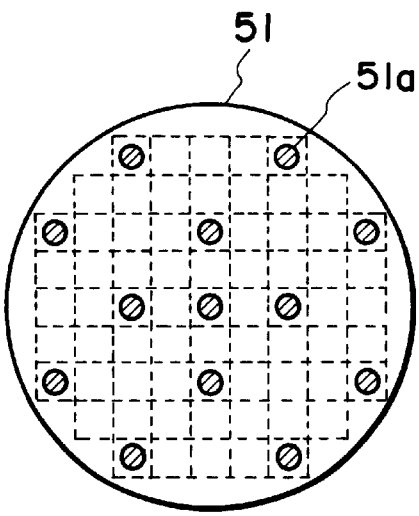
Figure 2D:
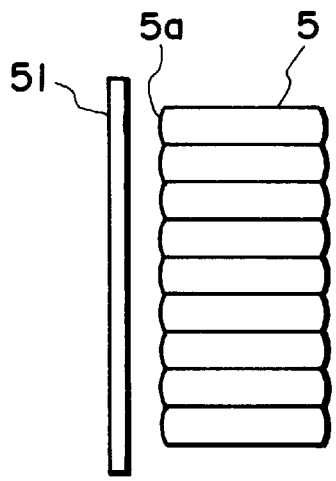
Figure 2E:
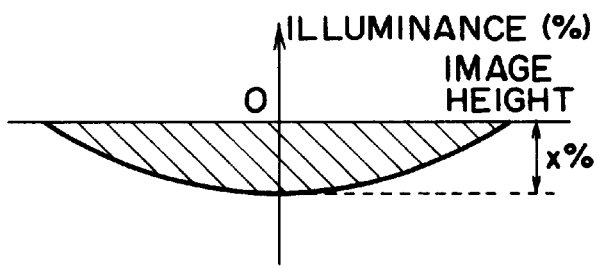

Light quantity controlling means (for example, driving means 100 for driving an optical filter 51) is provided for adjusting the quantity of light impinging on at least one of the small lens elements of the fly's eye lens 5, that is, for example, an ND filter 51 (FIG. 2C) having circular patterns 51a of Cr, for example, distributed thereon. The distance from the light entrance side 5a of the small lens elements of the fly's eye lens 5 is appropriately set as illustrated in FIG. 2D. The light entrance surface 5a of the fly's eye lens 5 having small lens elements, for superposed illumination of the surface to be illuminated is placed substantially optically conjugate with the surface to be illuminated. With this arrangement, since upon the surface being illuminated there occurs a decrease of illuminance at the axis, the illuminance distribution changes such as shown in FIG. 2E. This effectively corrects that illuminance non-uniformness that peripheral illuminance is low (FIG. 2B), such that the uniformness of illuminance over the surface illuminated can be improved significantly.

Figure 3A:
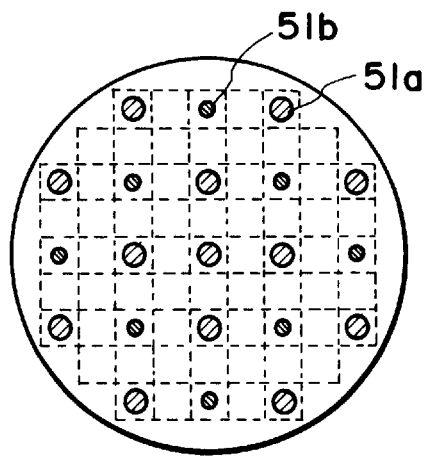
FIGS. 3A–3D are schematic views, respectively, for explaining another example of correction of non-uniformness of illuminance, in the first embodiment of the present invention.
Figure 3B:
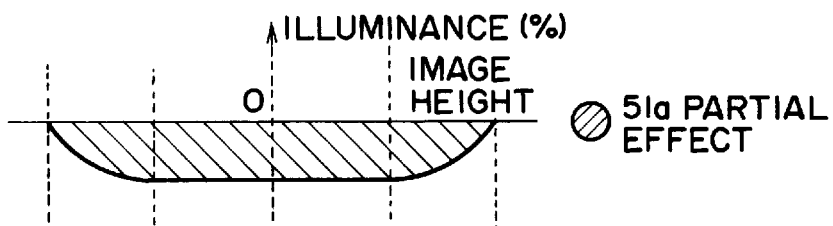
Figure 3C:
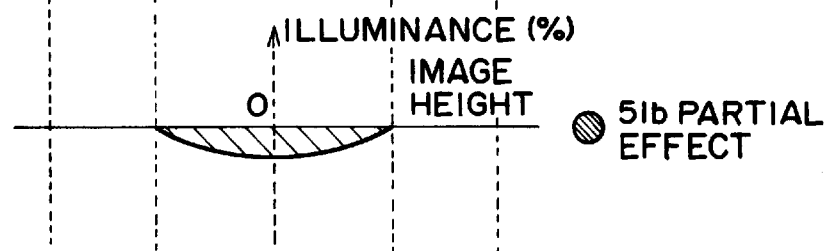
Figure 3D:
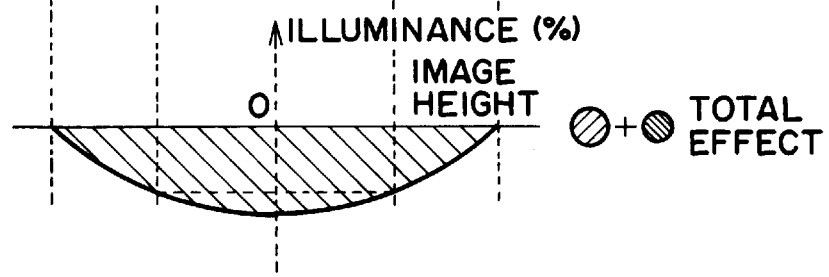

In place of the filter described above, the ND filter for correcting the illuminance non-uniformness in which the peripheral illuminance is low, may be one such as shown in FIG. 3A wherein circular light quantity adjusters 51a and 51b having different sizes are distributed. By appropriately setting the distance from the light entrance side 5a of the small lenses of the fly's eye lens 5, these adjusters 51a and 51b may function to provide effects such as shown in FIGS. 3B and 3C. Due to these effects in combination, the non-uniformness can be corrected such as shown in FIG. 3D. On the basis of this correction method and by appropriately adjusting diameters or transmission factors of the circular light quantity adjusting portions (e.g., by changing the operational ranges or correction amounts of them as shown in FIGS. 3B and 3C), not only is correction of the illuminance distribution at the central portion and peripheral portion of the surface illuminated assured, but also the correction effect over the whole illuminated surface, including the zone between the central portion and the peripheral portion of the illuminated surface can be optimized.

This optical filter, with its ND filter portions appropriately set with respect to pattern shape, transmission factor and placement, assures effective correction of illuminance non-uniformness which may result from a factor other than insufficient satisfaction of the sine condition of the fly's eye lens and than the influence of the anti-reflection film.

Figure 4A:
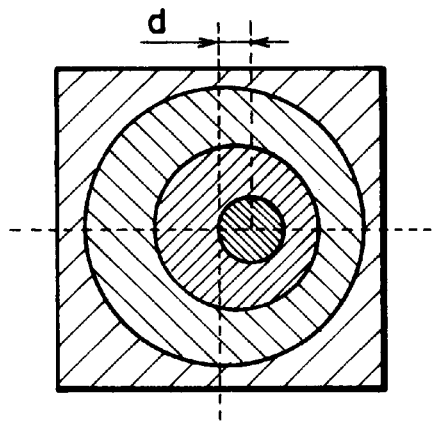
FIGS. 4A–4D are schematic views, respectively, for explaining correction of illuminance non-uniformness with inclination, in the first embodiment of the present invention.
Figure 4B:
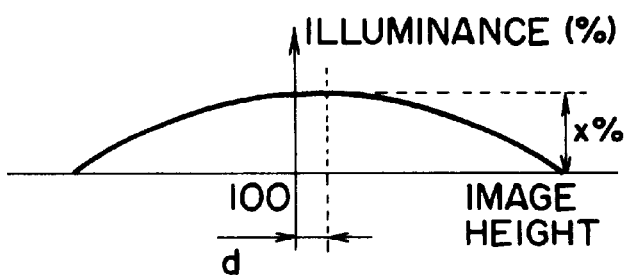
Figure 4C:
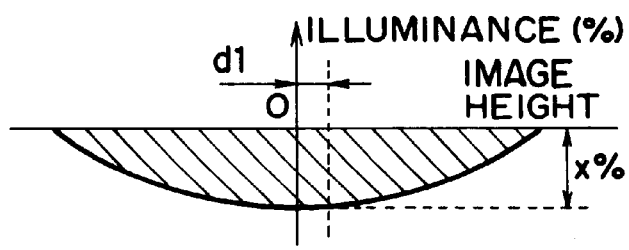
Figure 4D:
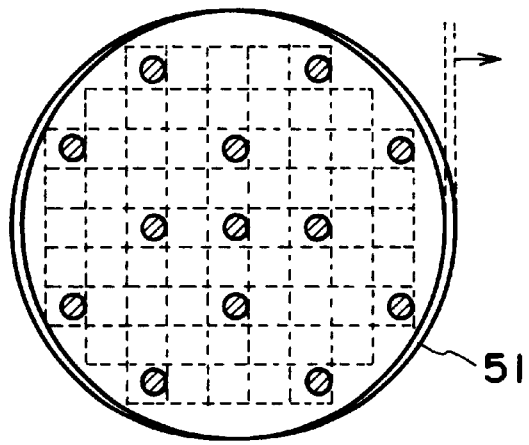

In this embodiment, the ND filter 51 may be made movable two-dimensionally along a direction perpendicular to the optical axis. On that occasion, illuminance non-uniformness being inclined asymmetrically with respect to the optical axis, such as shown in FIG. 4A or 4B, can be corrected. More specifically, the ND filter 51 may be moved in a direction perpendicular to the optical axis such as shown in FIG. 4D so as to apply correction, as shown in FIG. 4C, to the illuminance non-uniformness of FIGS. 4A and 4B.

[Embodiment 2]

Figure 5:
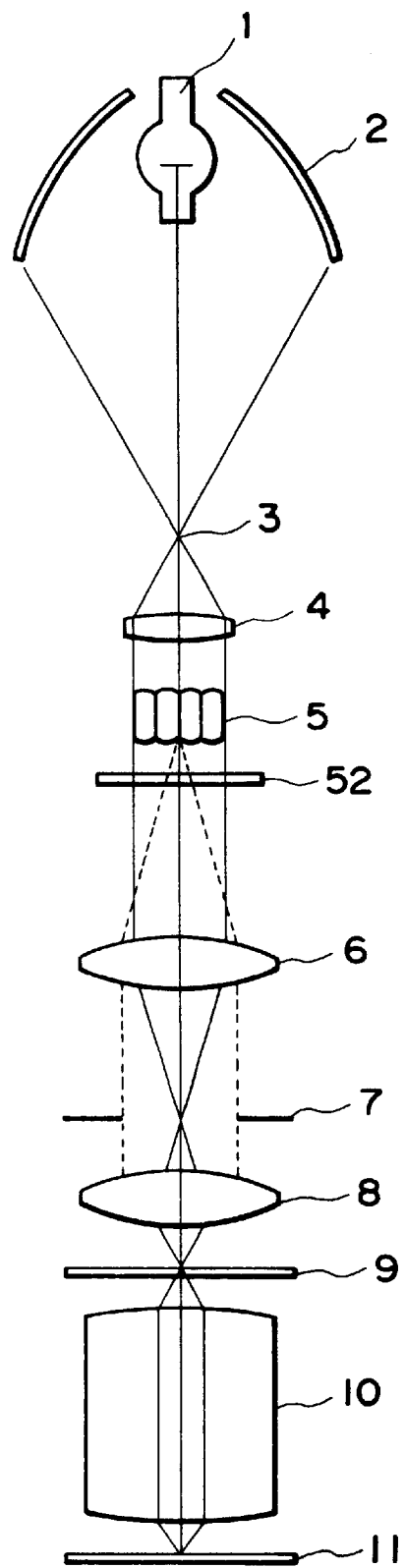
FIG. 5 is a schematic view of a projection exposure apparatus according to a second embodiment of the present invention.

FIG. 5 is a schematic view of a projection exposure apparatus having an illumination optical system according to a second embodiment of the present invention. In this embodiment, those elements denoted by the same reference numerals as those of the projection exposure apparatus of the first embodiment of FIG. 1 have a similar function. Therefore, a description of these elements will be omitted.

Figure 6A:
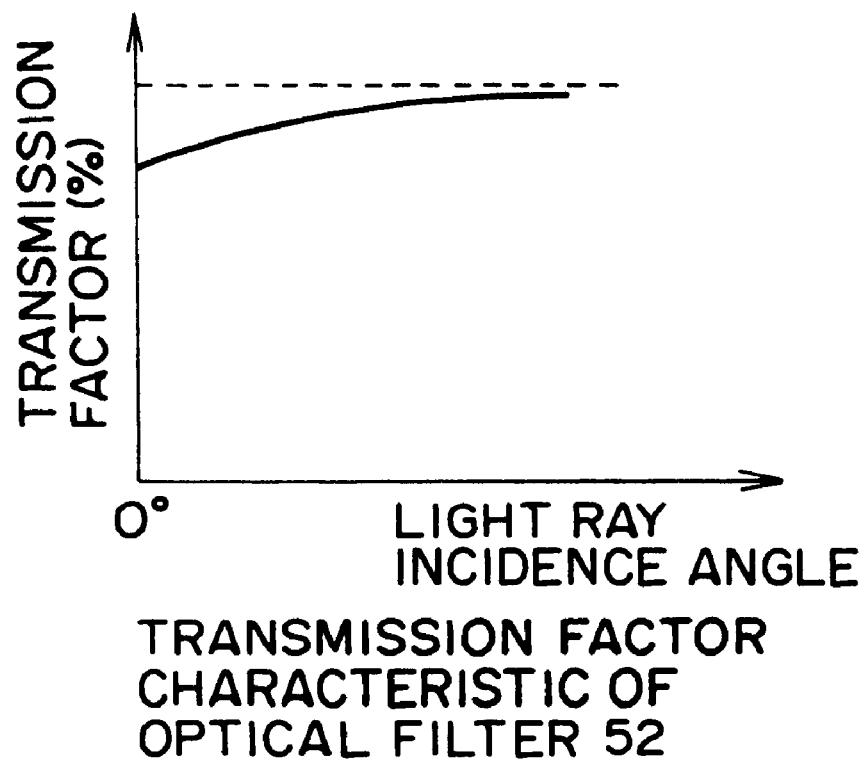
FIGS. 6A and 6B are schematic views, respectively, for explaining correction of non-uniformness of illuminance, in the second embodiment of the present invention.

As compared with the first embodiment wherein the illuminance uniforming means comprises ND filter 51, in this embodiment, an optical filter 52 having a characteristic that the transmission factor is changeable with the incidence angle of light, such as shown in FIG. 6A, is used. It is disposed at a position in a portion of the light path between the fly's eye lens 5 and the surface to be illuminated, at which position light rays which are going to impinge on a single point on the surface illuminated become substantially parallel to each other. This is an important feature of the present embodiment.

Figure 6B:
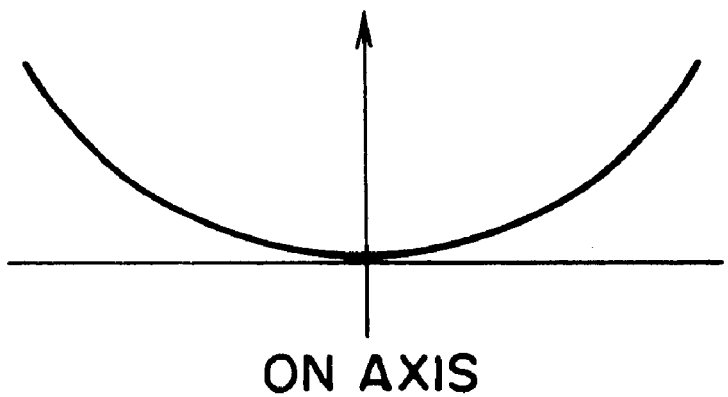

The optical filter 52 has a characteristic that its transmission factor increases in response to an increase of incidence angle of light. Therefore, upon the surface illuminated, the quantity of light impinging thereon increases, away from the axis, as shown in FIG. 6B. As a result, the illuminance non-uniformness in which the illuminance is low at the periphery can be corrected.

In this embodiment, the optical filter 52 may be tilted, by which illuminance non-uniformness being inclined asymmetrically with respect to the optical axis can be corrected.

[Embodiment 3]

Figure 7:
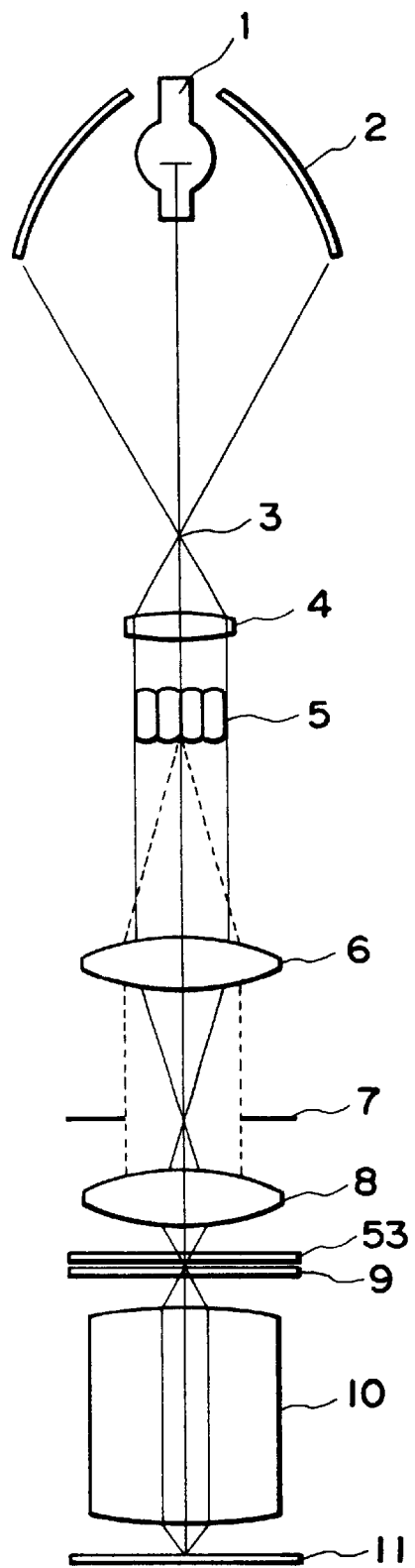
FIG. 7 is a schematic view of a projection exposure apparatus according to a third embodiment of the present invention.

FIG. 7 is a schematic view of a projection exposure apparatus having an illumination optical system according to a third embodiment of the present invention. In this embodiment, those elements denoted by the same reference numerals as those of the projection exposure apparatus of the first embodiment of FIG. 1 have a similar function. Therefore, a description of these elements will be omitted.

Figure 8A:
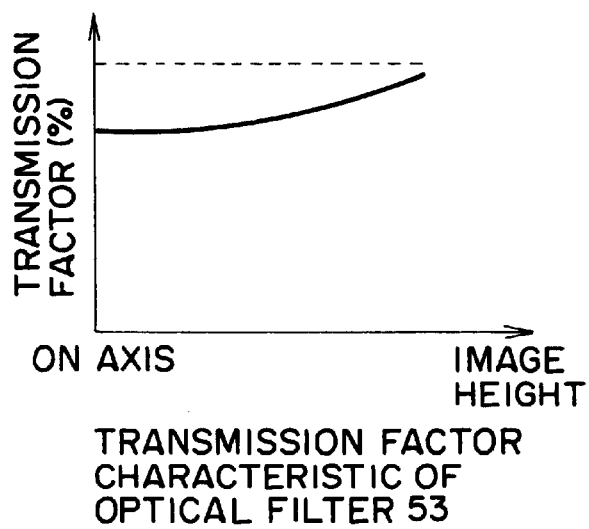
FIGS. 8A and 8B are schematic views, respectively, for explaining correction of non-uniformness of illuminance, in the third embodiment of the present invention.
Figure 8B:
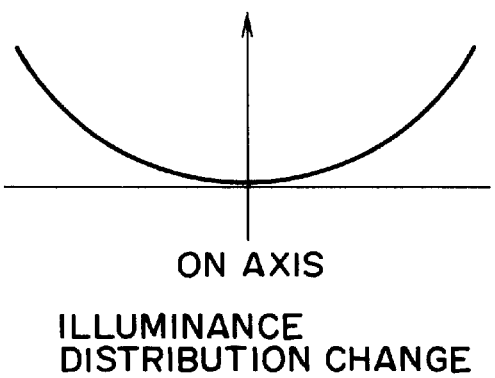

The projection exposure apparatus of this embodiment differs from those of the first and second embodiments in that an optical filter 53 having a characteristic that, as shown in FIG. 8A, the transmission factor is low on the axis and it increases, away from the axis, is disposed adjacent to the reticle surface. With this arrangement, since upon the surface illuminated, the illuminance on the axis is decreased such as shown in FIG. 8B, the illuminance non-uniformness in which peripheral illuminance is low, can be corrected.

[Embodiment 4]

As described hereinbefore, generally, if the distortion aberration of the condenser optical system 6 is made sufficiently small to remove the imbalance in size of secondary light sources as observed at the points on the surface illuminated, due to insufficient satisfaction of the sine condition by the fly's eye lens 5, the illuminance at the peripheral portion decreases. This problem can be solved by structuring a fly's eye lens to make small the magnitude of insufficiency of satisfaction of the sine condition of the fly's eye lens, such that a condition of h=F·sin θ can be satisfied substantively.

In order that dispersion of numerical apertures of the secondary light sources at points on the surface illuminated is suppressed to 3% or less so that the numerical apertures of the secondary light sources upon the surface illuminated can be regarded as being substantially uniform, if the magnitude OSC of insufficiency of satisfaction of the sine condition of the fly's eye lens is defined by:

$$OSC = h/\sin\theta - F$$

the insufficiency OSC of satisfaction of the sine condition should be kept at 1% or less of the focal length, as disclosed in Japanese Laid-Open Patent Application, Laid-Open No. 262367/1996 or U.S. Pat. No. 5,760,963.

Namely, from the relation OSC/F<1/100, the fly's eye lens of this embodiment should satisfy the relation:

$$|1 - h/(F \cdot \sin\theta)| < 1/100.$$

Figure 9:
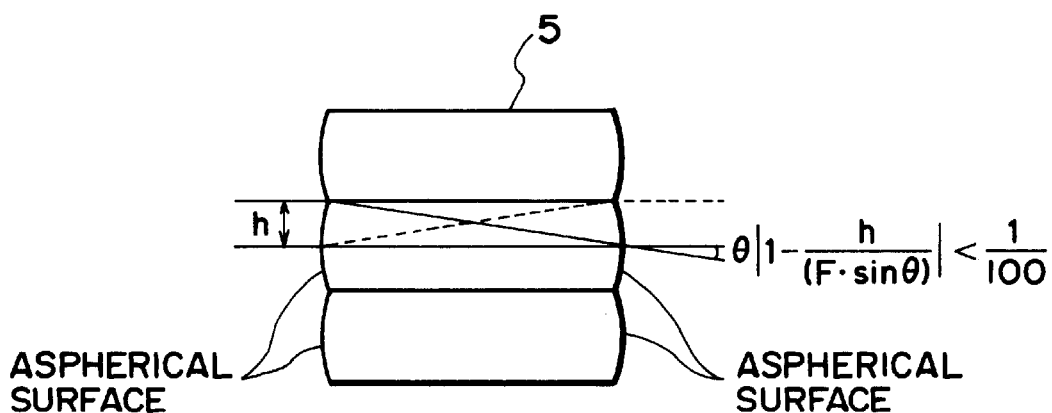
FIG. 9 is a schematic view of a fly's eye lens having aspherical surfaces.

In arguments on what can be called third-order aberration, it is known that an aspherical surface lens may be used to satisfy the sine condition. In this embodiment, lens surfaces of small lens elements, constituting the fly's eye lens, are formed into aspherical surfaces as shown in FIG. 9, by which the above-described condition is satisfied and by which the fly's eye lens sine condition is substantively satisfied.

[Embodiment 5]

Figure 10A:
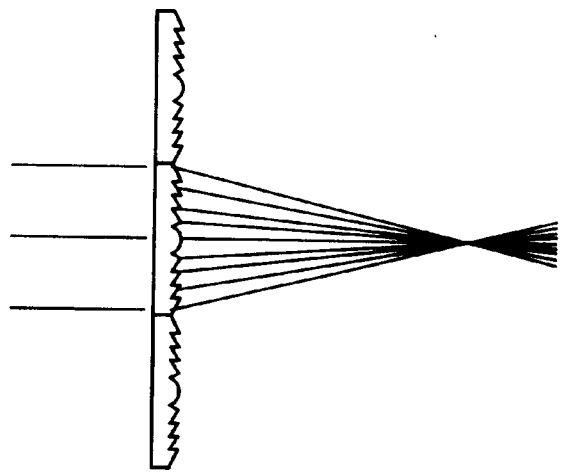
FIGS. 10A and 10B are schematic views, respectively, for explaining a fly's eye lens having diffractive optical surface.
Figure 10B:
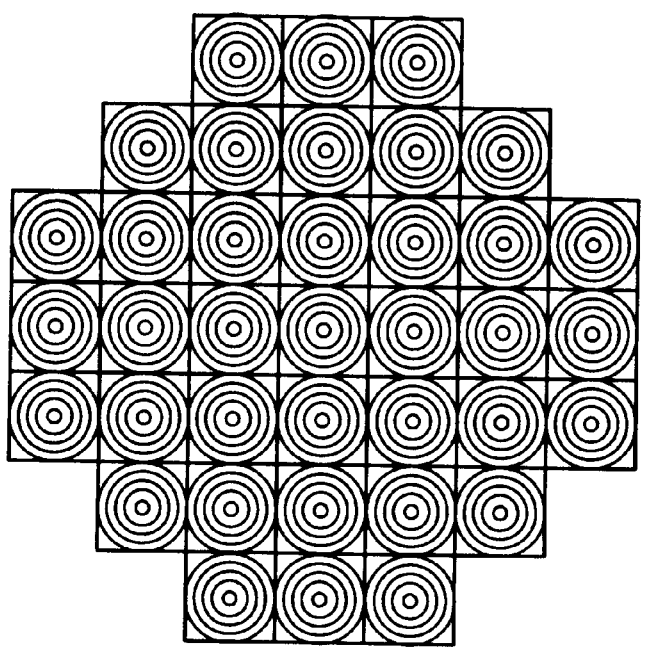

In this embodiment, in order to make small the magnitude of insufficiency of satisfaction of the fly's eye lens sine condition, the fly's eye lens is provided by a diffractive optical element such as shown in FIGS. 10A and 10B. In this embodiment, the diffractive optical element may be a Fresnel lens, a grating, or a binary optics element, for example. FIG. 10B shows an example wherein there are a plurality of fly's eye lenses each comprising a Fresnel lens.

Also, in this embodiment, in order that dispersion of numerical apertures of secondary light sources at points on the surface illuminated is suppressed to 3% or less so that the numerical apertures of the secondary light sources at points on the surface illuminated can be regarded as being substantively uniform, the fly's eye lens is structured to satisfy the condition:

$$|1-h/(F\sin\theta)|<1/100.$$

[Embodiment 6]

The methods of uniforming the numerical apertures of secondary light sources and uniforming the illuminance, having been described with reference to the first to fifth embodiments, are applicable to both a step-and-repeat type projection exposure apparatus and a step-and-scan type projection exposure apparatus.

The method to be described in this embodiment is applicable peculiarly to a step-and-repeat type projection exposure apparatus, and at least one of the objects of the present invention can be accomplished thereby.

Due to failure of satisfaction of the sine condition by the fly's eye lens, the illuminance decreases toward the periphery. This is also true with the case of a step-and-scan type exposure apparatus. In this type of exposure apparatus, however, since the exposure is made while performing scan, on the surface illuminated, there occurs exposure non-uniformness which is integrated with respect to a section along a direction perpendicular to the scan direction.

Figure 11:
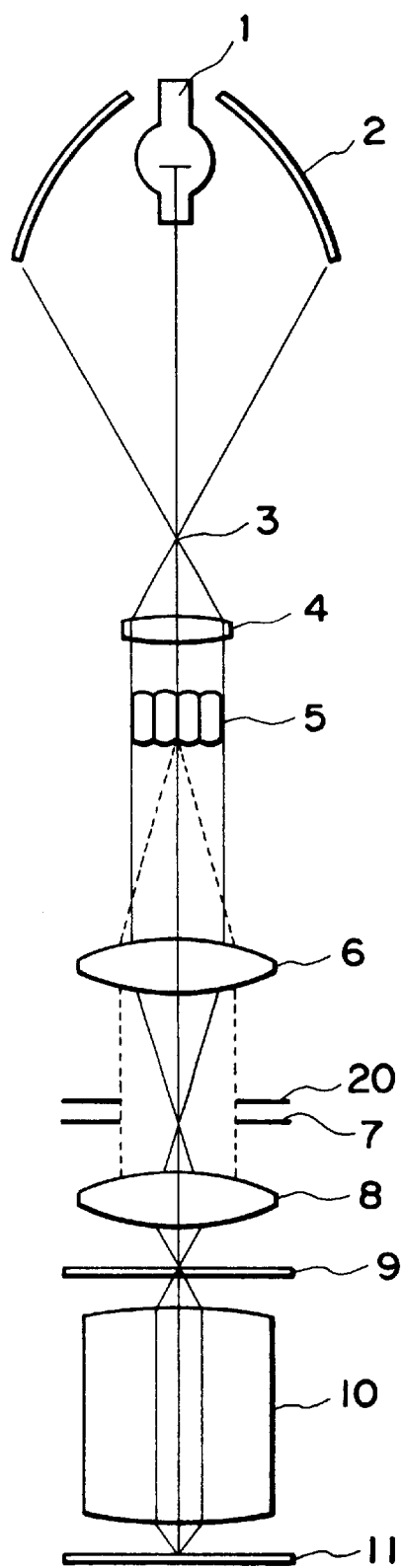
FIG. 11 is a schematic view of a projection exposure apparatus according to a sixth embodiment of the present invention.

In this embodiment, in order to effectively prevent such exposure non-uniformness, the width of a region to be illuminated with respect to the scan direction is made variable to any desired width. More specifically, as shown in FIG. 11, a variable slit 20 is disposed adjacent to a position which is optically conjugate with the surface to be illuminated. The variable slit 20 is arranged so that the width of the slit in the scan direction can be changed as desired. In FIG. 11, those elements denoted by the same reference numerals as those of the projection exposure apparatus of the first embodiment have a similar function. A description thereof will be omitted here.

Figure 12:
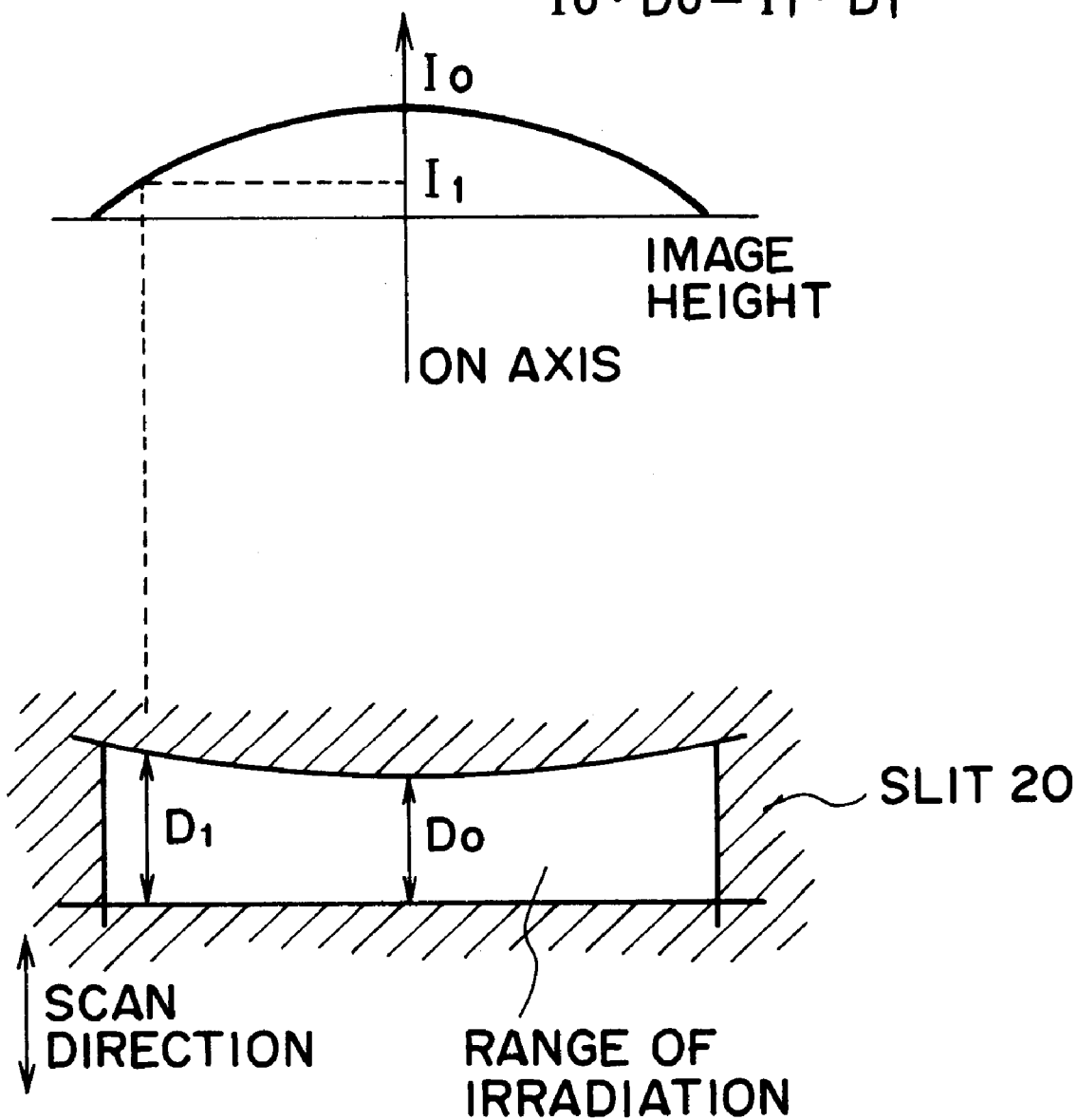
FIG. 12 is a schematic view for explaining correction of non-uniformness of light quantity as integrated with respect to a scan direction, in the sixth embodiment of the present invention.

In FIG. 12, if the light quantity at $X_0$ on the axis as integrated with respect to the scan direction is $I_0$, the light quantity at a certain image height $X_1$ as integrated with respect to the scan direction is $I_1$, the width of the slit portion on the axis is $D_0$, the width at the corresponding image height is $D_1$, then, by performing the scan operation while changing the width of the slit 20 to satisfy a relation $I_0 \times D_0 = I_1 \times D_1$, the integrated light quantity provided by the scan exposure can be made uniform over all of the image heights of the slit.

It is to be noted that, because the slit is made variable as desired, this method is effective to correct exposure non-uniformness resulting from a factor other than insufficient satisfaction of the fly's eye lens sine condition or than the influence of the anti-reflection film.

When the illumination condition is changed (for example, if the shapes of secondary light sources are changed from uniform circular apertures to ring-like apertures), there is a possibility that it causes a change in illuminance distribution such that the uniformness of illuminance on the surface illuminated cannot be maintained. Even on that occasion, in the step-and-scan type projection exposure apparatus according to this embodiment of the present invention, the uniformness of illuminance on the surface illuminated can be held by changing the width of the variable slit 20 in the scan direction. As an alternative, an optical filter having a predetermined characteristic may of course be inserted into the optical system, as has been described with reference to the first to third embodiments, to attain illuminance uniformness.

In the first to sixth embodiments, the light source 1 comprises a Hg lamp, for example. However, effective light sources may be produced by using a laser, for example, without any functional difference.

Figure 16:
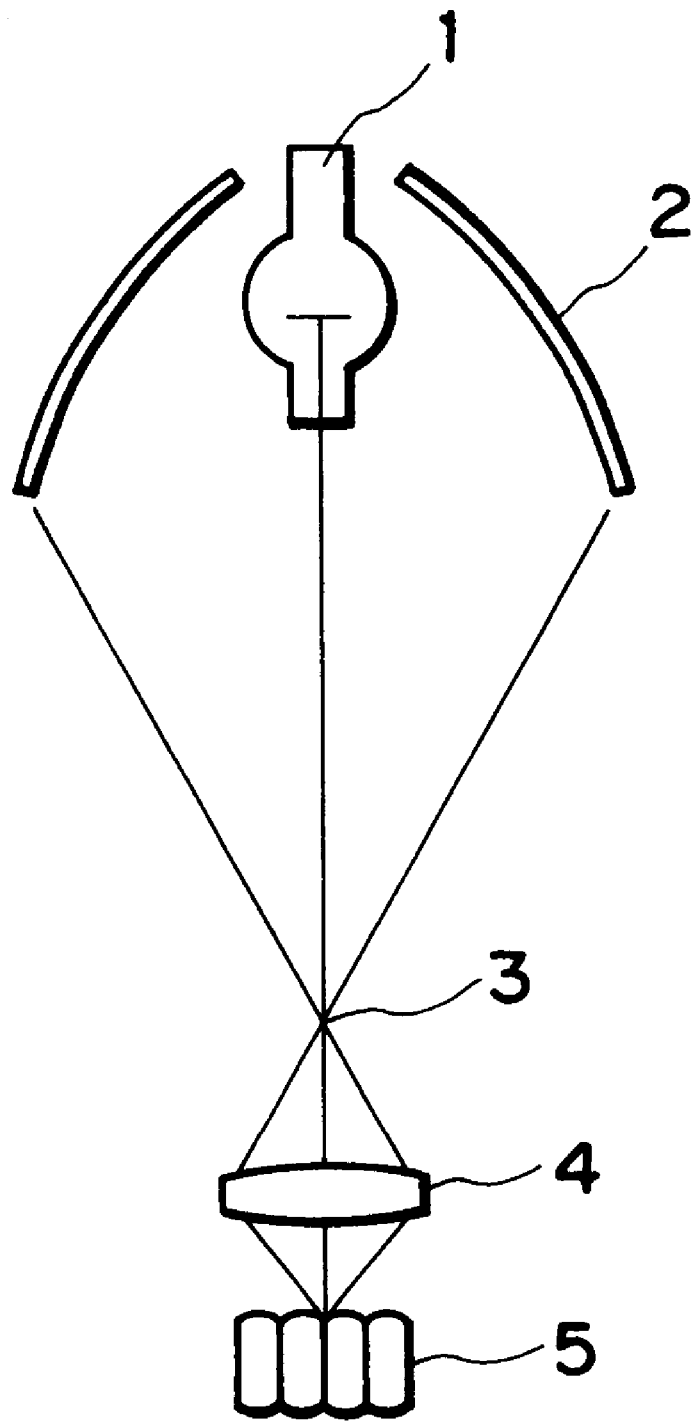
FIG. 16 is a schematic view of another example of an illumination optical system which can be incorporated into any one of the first to sixth embodiments of the present invention.

Also, in the first to sixth embodiments, the optical system 4 functions to collimate the light from an image of the light emitting portion of the light source 1 and to project it onto the light entrance surface of the fly's eye lens 5. However, as shown in FIG. 16, the optical system 4 may be arranged so that the image of the light emitting portion of the light source 1 is re-imaged in the vicinity of the light entrance surface of the fly's eye lens 5. In FIG. 16, the components after the fly's eye lens 5 are not illustrated.

In accordance with the first to sixth embodiments of the present invention as described hereinbefore, an illumination optical system and a projection exposure apparatus, by which both the uniformness of illuminance upon a surface to be illuminated and the uniformness of illumination numerical apertures can be improved, are accomplished.

[Embodiment 7]

Next, an embodiment of a semiconductor device manufacturing method which uses a projection exposure apparatus according to any one of the first to sixth embodiments, described above, will be explained.

Figure 13:
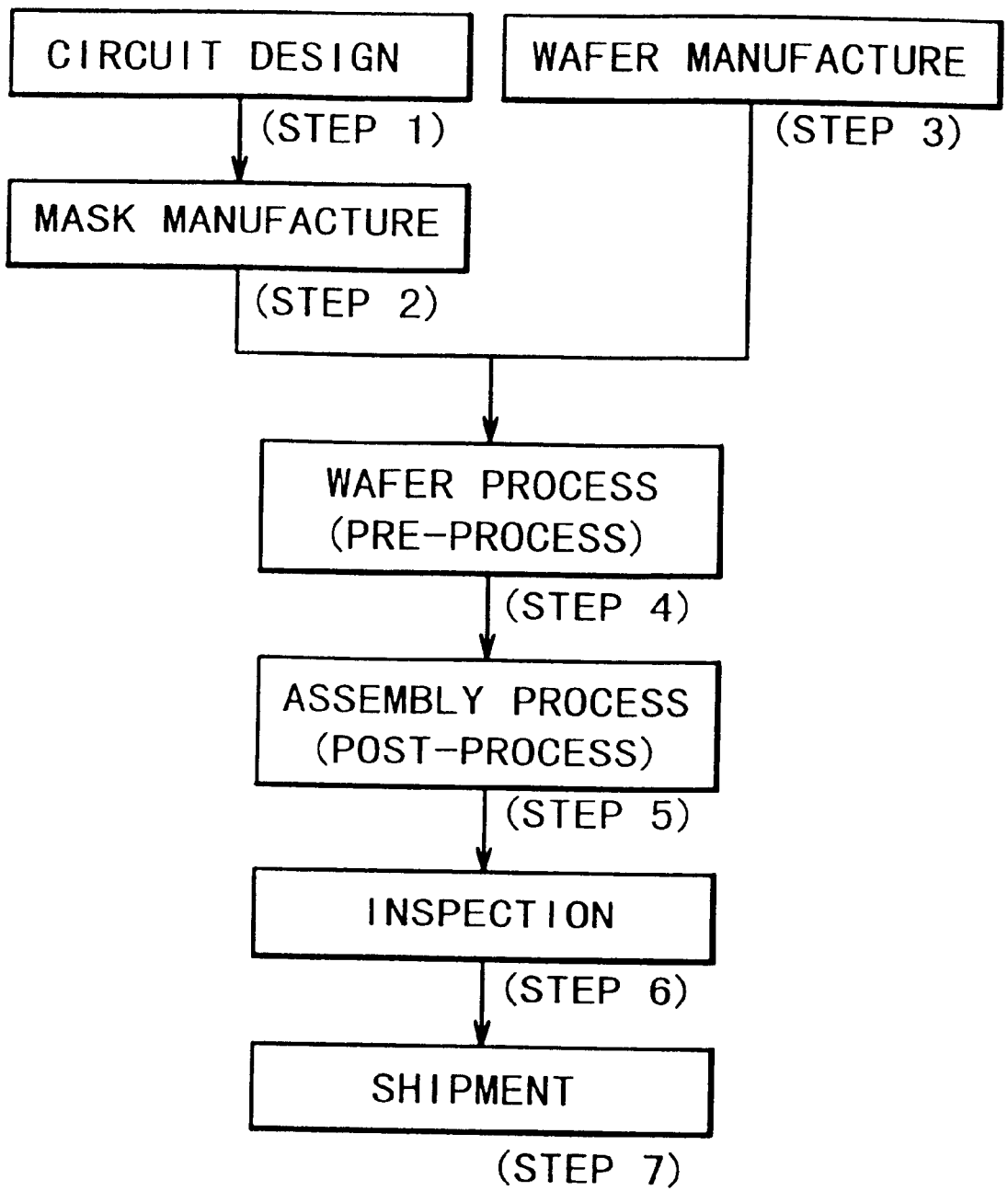
FIG. 13 is a flow chart of a semiconductor device manufacturing procedure.

FIG. 13 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
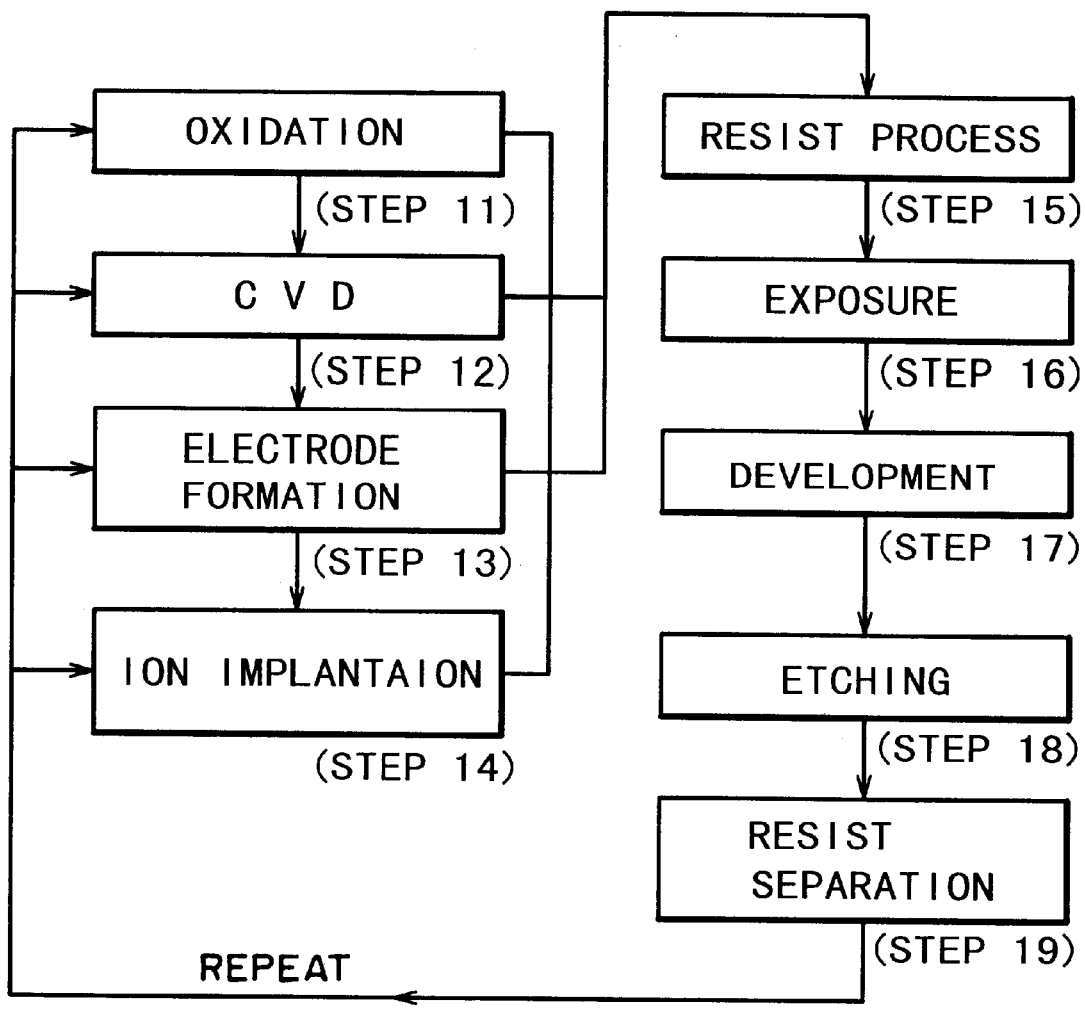
FIG. 14 is a flow chart for explaining details of a wafer process, in the procedure of FIG. 13.
Figure 15A:
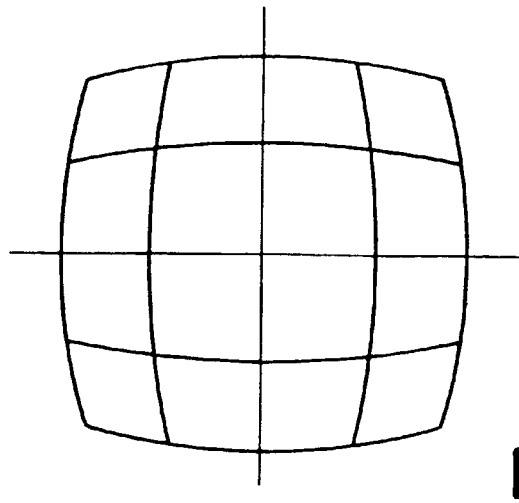
FIGS. 15A and 15B are schematic views, respectively, for explaining a conventional illumination optical system.
Figure 15B:
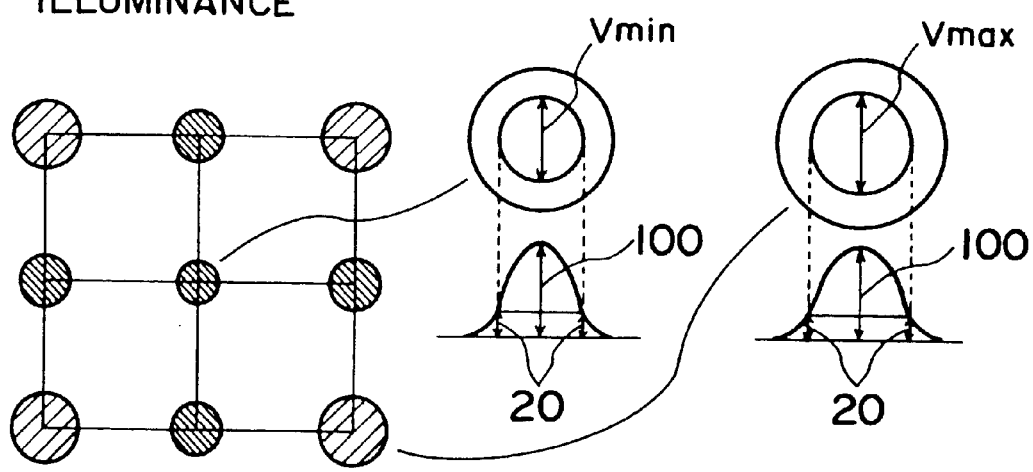

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

What is claimed is:

1. An illumination optical system, comprising:

a fly's eye lens, having a plurality of lens elements, for forming secondary light sources by use of light from a light source;

optical means for illuminating a surface to be illuminated, with light from the secondary light sources, wherein said optical means is arranged to assure that the secondary light sources as seen from points on the surface illuminated have substantially the same numerical aperture;

an optical filter disposed at an entrance side of said fly's eye lens, for reducing non-uniformness of illuminance in an illumination region upon the surface illuminated, by restricting a quantity of light entering a desired lens element of the plurality of lens elements, constituting said fly's eye lens; and driving means for driving said optical filter.

2. An illumination optical system according to claim 1, wherein said optical means is arranged to satisfy a relation $\sigma_{max}/\sigma_{min} < 1.03$ where, within regions of the secondary light sources as seen from points on the surface illuminated, which regions have substantially the same light intensity, $\sigma_{max}$ is a largest diameter and $\sigma_{min}$ is a smallest diameter.

3. An illumination optical system, comprising:

a fly's eye lens for forming a secondary light sources by use of light from a light source, said fly's eye lens having a plurality of lens elements each comprising an aspherical surface lens; and optical means for illuminating a surface to be illuminated, with light from the secondary light sources, wherein said optical means is arranged to assure that the secondary light sources as seen from points on the surface illuminated have substantially the same numerical aperture, wherein said aspherical surface lens is designed to satisfy a relation $$|1 - h/(F \cdot \sin \theta)| < 1/100,$$

where F is a focal length of each lens element, h is a largest incidence height of a light ray parallel to the optical axis of the lenses, and θ is an angle defined, with respect to the optical axis, by an emerging light ray having been incident at the largest incidence height h.

4. An illumination optical system, comprising:

a fly's eye lens for forming secondary light sources by use of light from a light source, said fly's eye lens having a plurality of lens elements each comprising a diffractive optical element; and optical means for illuminating a surface to be illuminated, with light from the secondary light sources, wherein said optical means is arranged to assure that the secondary light sources as seen from points on the surface illuminated have substantially the same numerical aperture, wherein said diffractive optical element is designed to satisfy a relation $$|1 - h/(F \cdot \sin \theta)| < 1/100,$$

where F is a focal length of each lens element, h is a largest incidence height of a light ray parallel to the optical axis of the lenses, and θ is an angle defined, with respect to the optical axis, by an emerging light ray having been incident at the largest incidence height h.

5. An illumination optical system, comprising:

secondary light source forming means for forming secondary light sources by use of light from a light source;

optical means for illuminating a surface to be illuminated, with light from the secondary light sources, wherein said optical means is arranged to assure that the secondary light sources as seen from points on the surface illuminated have substantially the same numerical aperture;

scanning means for scanning the surface to be illuminated, wherein the surface to be illuminated is illuminated while being scanned by said scanning means; and a slit disposed adjacent to a plane optically conjugate with the surface to be illuminated, for defining an illumination region upon the surface to be illuminated, wherein the width of the slit in the scan direction at each position along a direction perpendicular to the scan direction is determined to assure that an integrated light quantity in a scanned region on the surface to be illuminated becomes substantially uniform, and wherein the width of the slit in the scan direction at a first position, of the positions, and the width of the slit in the scan direction at a second position, of the positions, differ from each other.

6. A projection exposure apparatus, comprising:

an illumination optical system including (i) a fly's eye lens, having a plurality of lens elements, for forming secondary light sources by use of light from a light source, (ii) optical means for directing light from the secondary light sources to a reticle, wherein said optical means is arranged to assure that the secondary light sources as seen from points on the reticle have substantially the same numerical aperture, (iii) an optical filter disposed at an entrance side of said fly's eye lens for reducing non-uniformness of illuminance in an illumination region upon the surface illuminated, by restricting a quantity of light entering a desired lens element of the plurality of lens elements, constituting said fly's eye lens, and (iv) driving means for driving said optical filter; and a projection optical system for projecting a pattern, formed on the reticle, onto the surface of a wafer.

7. An apparatus according to claim 6, wherein said optical means is arranged to satisfy a relation $\sigma_{max}/\sigma_{min} < 1.03$ where, within regions of the secondary light sources as seen from points on the surface illuminated, which regions have substantially the same light intensity, $\sigma_{max}$ is a largest diameter and $\sigma_{min}$ is a smallest diameter.

8. A projection exposure apparatus, comprising:

an illumination optical system including (i) a fly's eye lens for forming secondary light sources by use of light from a tight source, said fly's eye lens having a plurality of lens elements each comprising an aspherical surface lens, and (ii) optical means for directing light from the secondary light sources to illuminate a reticle, wherein said optical means is arranged to assure that the secondary light sources as seen from points on the surface illuminated have substantially the same numerical aperture; and a projection optical system for projecting a pattern formed on the reticle, onto a surface of a wafer, wherein said aspherical surface lens is designed to satisfy a relation $$|1-h/(F\cdot\sin\theta)|<1/100,$$

where F is a focal length of each lens element, h is a largest incidence height of a light ray parallel to the optical axis of the lenses, and θ is an angle defined, with respect to the optical axis, by an emerging light ray having been incident at the largest incidence height h.

9. A projection exposure apparatus, comprising:

an illumination optical system including (i) a fly's eye lens for forming a secondary light source by use of light from a light source, said fly's eye lens having a plurality of lens elements each comprising a diffractive optical element, and (ii) optical means for directing light from the secondary light source to illuminate a reticle, wherein said optical means is arranged to assure that the secondary light sources as seen from points on the recticle have substantially the same numerical aperture; and a projection optical system for projecting a pattern formed on the reticle, onto a wafer, wherein said diffractive optical element is designed to satisfy a relation $$|1-h/(F\cdot\sin\theta)|<1/100,$$

where F is a focal length of each lens element, h is a largest incidence height of a light ray parallel to the optical axis of the lenses, and θ is an angle defined, with respect to the optical axis, by an emerging light ray having been incident at the largest incidence height h.

10. A projection exposure apparatus, comprising:

an illumination optical system including (i) secondary light source forming means for forming secondary light sources by use of light from a light source, and (ii) optical means for directing light from the secondary light sources to a reticle, wherein said optical means is arranged to assure that the secondary light sources as seen from points on a surface illuminated have substantially the same numerical aperture;

a projection optical system for projecting a pattern formed on the reticle, onto a surface of a wafer;

scanning means for scanning the reticle and the wafer in synchronism with each other, wherein the pattern is transferred to the wafer with the scan by said scanning means; and a slit disposed adjacent to a plane optically conjugate with the surface to be illuminated, for defining an illumination region upon the surface to be illuminated, wherein the width of the slit in the scan direction at each position along a direction perpendicular to the scan direction is determined to assure that an integrated light quantity in a scanned region on the surface to be illuminated becomes substantially uniform, and wherein the width of the slit in the scan direction at a first position, of the positions, and the width of the slit in the scan direction at a second position, of the positions, differ from each other.

11. A device manufacturing method, comprising the steps of:

providing an illumination optical system including (i) a fly's eye lens, having a plurality of lens elements, for forming secondary light sources by use of light from a light source, (ii) optical means for directing light from the secondary light sources to a reticle, wherein the optical means is arranged to assure that the secondary light sources as seen from points on the reticle have substantially the same numerical aperture, (iii) an optical filter disposed at an entrance side of said fly's eye lens, for reducing non-uniformness of illuminance in an illumination region upon the surface illuminated by restricting a quantity of light entering a desired lens element of the plurality of lens elements, constituting the fly's eye lens, and (iv) driving means for driving the optical filter, projecting, with a projection optical system, a pattern, formed on the reticle, onto the surface of a wafer;

transferring, by exposure, a pattern formed on a reticle onto a wafer; and developing the pattern transferred to the wafer.

12. A device manufacturing method, comprising the steps of:

providing an illumination optical system including (i) a fly's eye lens for forming secondary light sources by use of light from a light source, the fly's eye lens having a plurality of lens elements each comprising an aspherical surface lens, and (ii) optical means for directing light from the secondary light sources to illuminate a reticle, wherein said optical means is arranged to assure that the secondary light sources as seen from points on the surface illuminated have substantially the same numerical aperture;

projecting, with a projection optical system, a pattern formed on the reticle, onto a surface of a wafer, wherein the aspherical lens is designed to satisfy a relation $$|1-h/(F\cdot\sin\theta)|<1/100,$$

where F is a focal length of each lens element, h is a largest incidence height of a light ray parallel to the optical axis of the leases, and θ is an angle defined, with respect to the optical axis, by an emerging light ray having been incident at the largest incidence height h;

transferring, by exposure, a pattern formed on a reticle onto a wafer; and developing the pattern transferred to the wafer.

13. A device manufacturing method, comprising the steps of:

providing an illumination optical system including (i) a fly's eye lens for forming secondary light sources by use of light from a light source, the fly's eye lens having a plurality of lens elements each comprising a diffractive optical clement, and (ii) optical means for directing light from the secondary light sources to illuminate a reticle, wherein said optical means is arranged to assure that the secondary light sources as seen from points on the surface illuminated have substantially the same numerical aperture;

projecting, with a projection optical system, a pattern formed on the reticle, onto a surface of a wafer, wherein the aspherical surface lens is designed to satisfy a relation

|1−h/(F·sin θ)|<1/100, where F is a focal length of each lens element, h is a largest incidence height of a light ray parallel to the optical axis of the lenses, and θ is an angle defined, with respect to the optical axis, by an emerging light ray having been incident at the largest incidence height h;

transferring, by exposure, a pattern formed on a reticle onto a wafer; and developing the pattern transferred to the wafer.

14. A device manufacturing method, comprising the steps of:

providing an illumination optical system including (i) secondary light source forming means for forming secondary light sources by use of light from a light source, and (ii) optical means for directing light from the secondary light sources to a reticle, wherein the optical means is arranged to assure that the secondary light sources as seen from points on a surface illuminated have substantially the same numerical aperture;

projecting, with a projection optical system, a pattern formed on the reticle, onto a surface of a wafer;

scanning, with scanning means, the reticle and the wafer in synchronism with each other, wherein the pattern is transferred to the wafer with the scan;

disposing a slit adjacent to a plane optically conjugate with the surface to be illuminated, for defining an illumination region upon the surface to be illuminated, wherein the width of the slit in the scan direction at each position along a direction perpendicular to the scan direction is determined to assure that an integrated light quantity in a scanned region on the surface to be illuminated becomes substantially uniform, and wherein the width of the slit in the scan direction at a first position, of the positions, and the width of the slit in the scan direction at a second position, of the positions, differ from each other;

transferring, by exposure, a pattern formed on a reticle onto a wafer; and developing the pattern transferred to the wafer.

* * * * *

UNITED STATES PATENT AND TRADEMARK OFFICE
CERTIFICATE OF CORRECTION

PATENT NO.      : 6,665,052 B2
DATED           : December 16, 2003
INVENTOR(S)     : Hiroshi Sato It is certified that error appears in the above-identified patent and that said Letters Patent is hereby corrected as shown below:

Title page,
Item "[*] Notice:," insert the following paragraph:

-- This patent issued on a continued prosecution application filed under 37 CFR 1.53(d), and is subject to the twenty year patent term provisions of 35 U.S.C. 154(a)(2). --.

Column 2,
Line 39, "low of" should read -- low, --.

Column 5,
Line 53, "having" should read -- having a --.

Column 11,
Line 11, "secondary light sources" should read -- a secondary light source --.
Line 15, 41 and 63, "sources," should read -- source, --.
Line 18, "surface" should read -- surface to be --.
Lines 31 and 35, "sources" should read -- source --.
Line 53, "lenses," should read -- lens, --.
Line 57, "secondary light sources" should read -- a secondary light source --.
Line 65, "sources" should read -- source -- and "surface" should read -- surface to be --.
Line 66, "have" should read -- has --.

Column 12,
Line 7, "lenses," should read -- lens, --.
Line 11, "sec-" should read -- a sec- --.
Line 12, 41, 56 and 67, "sources" should read -- source --.
Line 15, "sources," should read -- source, --.
Line 17, "sources" should read -- source -- and "surface" should read -- surface to be --.
Line 18, "have" should read -- has --.
Line 39, "secondary light sources" should read -- a secondary light source --.
Line 43, "sources" should read -- source -- and "have" should read -- has --.
Line 47, "surface illuminated," should read -- reticle, --.
Line 53, "the surface of" should be deleted.
Line 57, "surface illuminated," should read -- reticle, --.
Line 62, "secondary light sources" should read -- a secondary light source --.

UNITED STATES PATENT AND TRADEMARK OFFICE
CERTIFICATE OF CORRECTION

PATENT NO. : 6,665,052 B2
DATED : December 16, 2003
INVENTOR(S) : Hiroshi Sato

It is certified that error appears in the above-identified patent and that said Letters Patent is hereby corrected as shown below:

Column 13,
Line 2, "sources" should read -- source --.
Line 3, "surface illuminated" should read -- reticle -- and "have" should read -- has
Line 6, "a surface of" should be deleted.
Line 25, "sources" should read -- source --.
Line 26, "have" should read -- has --.
Line 43, "sources" should read -- source --.
Line 45, "sources" should read -- source --.
Lines 47, "a surface illuminated" should read -- the reticle --.
Line 56, "surface to be illuminated," should read -- reticle, --.
Line 57, "surface to be illuminated" should read -- reticle, --.
Line 62, "surface to be" should read -- reticle --.
Line 62, "illuminated" should be deleted.

Column 14,
Line 5, "secondary light sources" should read -- a secondary light source --.
Line 7, "sources" should read -- source --.
Line 9, "sources" should read -- source -- and "have" should read -- has --.
Line 13, "surface illuminated" should read -- reticle --.
Line 20, "the surface of" should be deleted.
Line 21, both occurrences of "a" should read -- the --.
Line 22, "a" should read -- the --.
Line 23, "the pattern transferred to" should be deleted.
Line 27, "secondary light sources" should read -- a secondary light source --.
Lines 32 and 34, "sources" should read -- source --.
Line 35, "surface illuminated" should read -- reticle -- and "have" should read -- has --.
Line 39, " a surface of" should be deleted.
Line 49, both occurrences of "a" should read -- the --.
Line 50, "a" should read -- the --.
Line 51, "the pattern transferred to" should be deleted.
Line 56, "secondary light sources" should read -- a secondary light source --.
Lines 60 and 62, "sources" should read -- source --.
Line 63, "surface illuminated" should read -- reticle -- and "have" should read -- has --.
Line 66, "a surface of" should be deleted.

UNITED STATES PATENT AND TRADEMARK OFFICE
CERTIFICATE OF CORRECTION

PATENT NO. : 6,665,052 B2
DATED : December 16, 2003
INVENTOR(S) : Hiroshi Sato

It is certified that error appears in the above-identified patent and that said Letters Patent is hereby corrected as shown below:

Column 15,
Line 10, both occurrences of "a" should read -- the --.
Line 11, "a" should read -- the --.
Line 12, "the pattern transferred to" should be deleted.
Line 17, "secondary light sources" should read -- a secondary light source --.
Line 20, "sources" should read -- source --.
Line 22, "sources" should read -- source -- and "surface illumi-" should read -- reticle --.
Line 23, "nated" should be deleted and "have" should read -- has --.

Column 16,
Lines 7 and 8, "surface to be illuminated," should read -- reticle, --.
Line 13, "surface to be" should read -- reticle --.
Line 14, "illuminated" should be deleted.
Line 19, both occurrences of "a" should read -- the --.
Line 20, "a" should read -- the --.
Line 21, "the pattern transferred to" should be deleted.

Signed and Sealed this

Thirty-first Day of August, 2004

JON W. DUDAS
*Director of the United States Patent and Trademark Office*